United States Patent [19]
Kim et al.

[11] Patent Number: 5,818,767
[45] Date of Patent: Oct. 6, 1998

[54] WIRE CONTROL CIRCUIT AND METHOD

[75] Inventors: Kyung-Yul Kim; Jong-Hoon Park, both of Choongcheongbuk-Do, Rep. of Korea

[73] Assignee: LG Semicon Co., Ltd., Cheongju, Rep. of Korea

[21] Appl. No.: 895,448

[22] Filed: Jul. 16, 1997

[30] Foreign Application Priority Data

Jul. 22, 1996 [KR] Rep. of Korea .................. 1996-29548

[51] Int. Cl.$^6$ .................................................. G11C 7/00
[52] U.S. Cl. ...................... 365/191; 365/189.05; 365/194
[58] Field of Search ................................ 365/191, 189.05, 365/194, 230.08, 189.01

[56] References Cited

U.S. PATENT DOCUMENTS

| | | | |
|---|---|---|---|
| 5,394,363 | 2/1995 | Han | 365/194 |
| 5,629,896 | 5/1997 | McClure | 365/230.08 |
| 5,650,978 | 7/1997 | Ukita et al. | 365/191 |
| 5,724,287 | 3/1998 | Takenaka | 365/191 |

*Primary Examiner*—Son T. Dinh
*Attorney, Agent, or Firm*—Fleshner & Kim

[57] ABSTRACT

A write control circuit performs write control of data in a write cycle using consistent parametric control according to a control signal and a write enable signal. A first buffer outputs a buffered control signal based on the control signal, and a second buffer outputs a buffered write enable signal based on the buffered control signal from the first buffer and the write enable signal. A write controller detects an input condition of the control signal and the write enable signal and outputs a delay control signal. A write control signal generator selects a delayed signal based on the delay control signal from the write controller and generates a write control signal, and an output unit outputs input data to data lines in accordance with the generated write control signal.

16 Claims, 6 Drawing Sheets

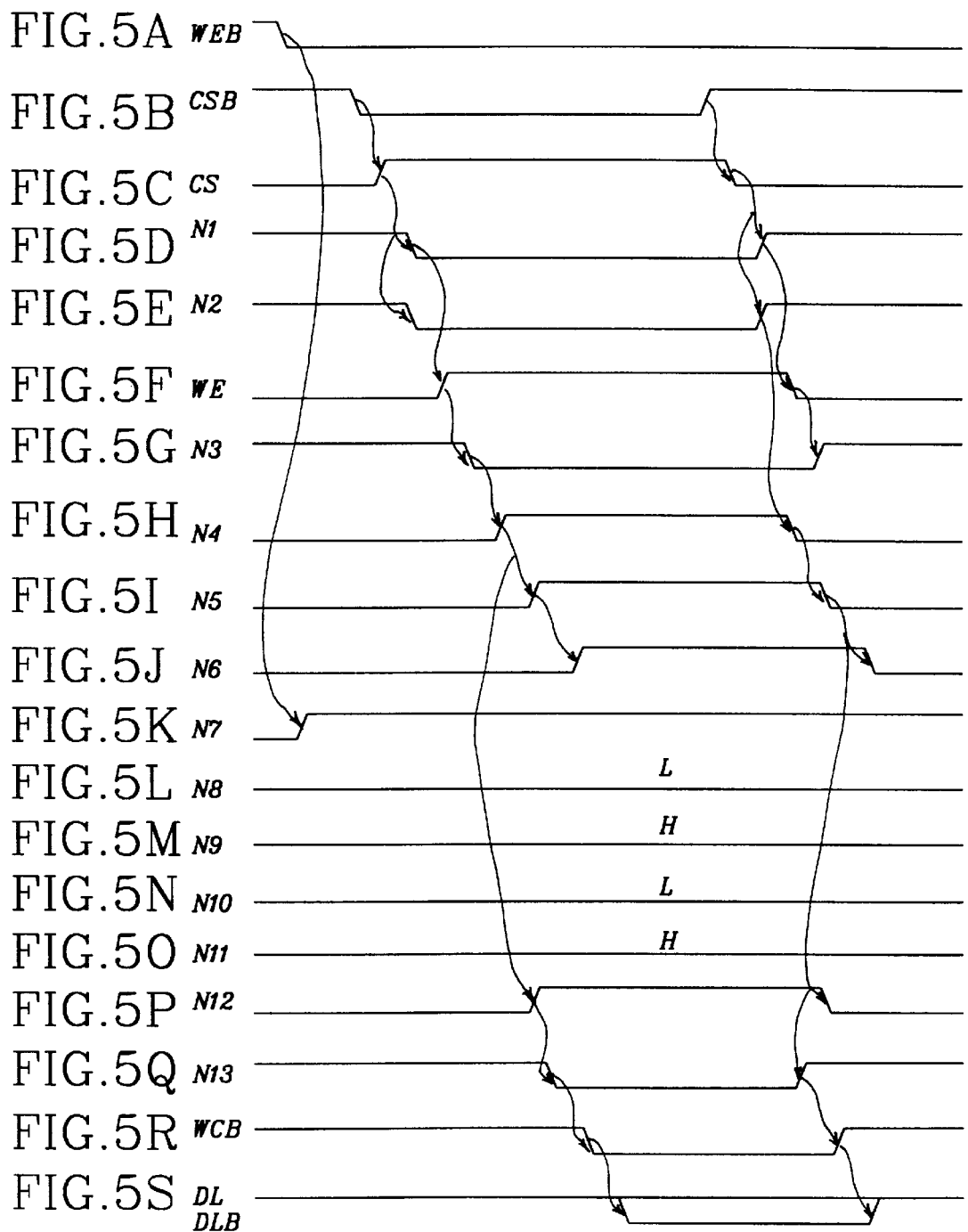

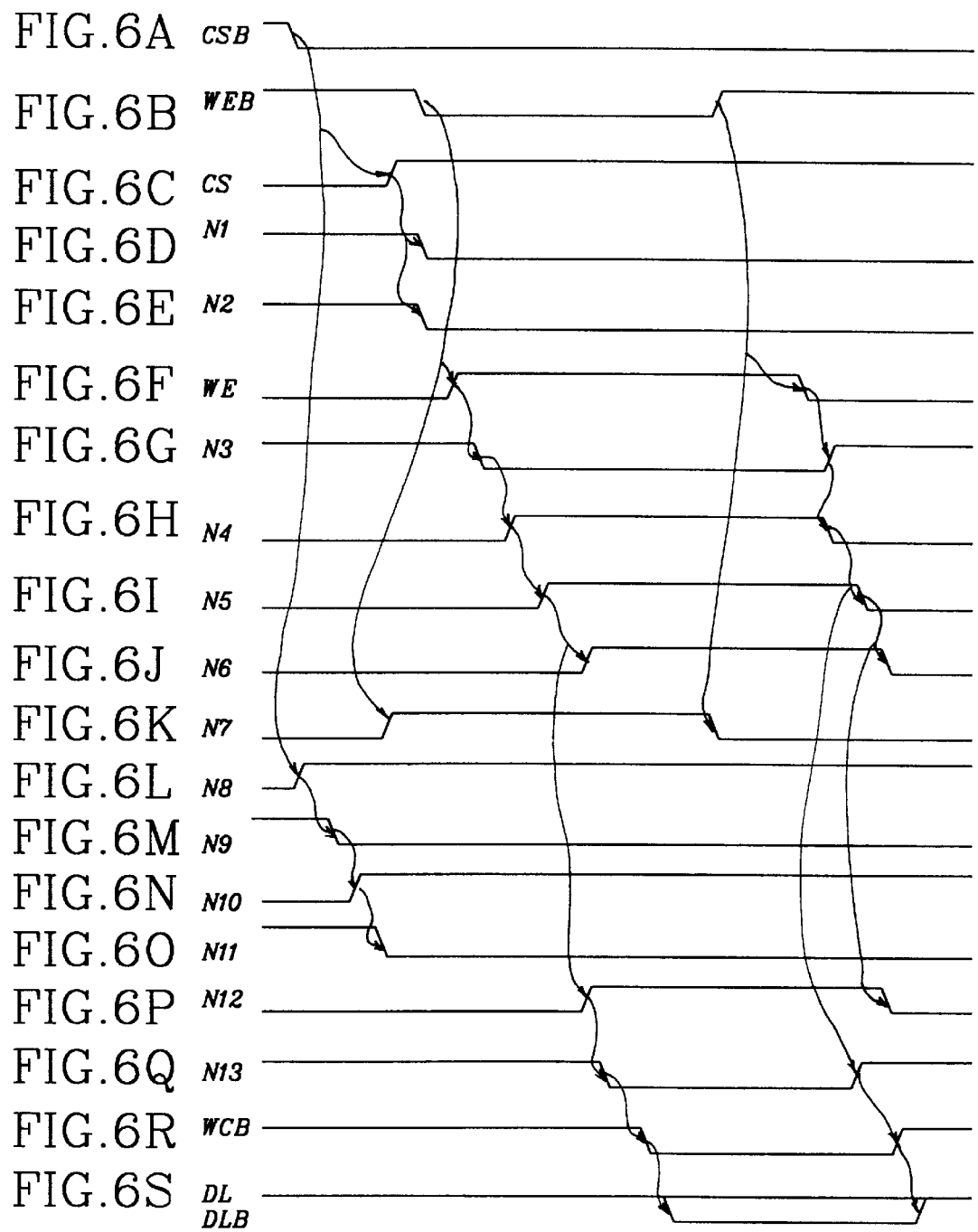

WIRE CONTROL CIRCUIT AND METHOD

BACKGROUND OF THE INVENTION

1. Field of the Invention

The present invention relates to a semiconductor memory device, and more particularly, to a write control circuit for a semiconductor memory device.

2. Background of the Related Art

FIG. 1 shows a related art write control circuit. The write control circuit includes a first buffer 10, a second buffer 20, a write control signal generator 30 and an output unit 40. The first buffer 10 outputs a buffered control signal (CS) by operating and delaying an input control signal (CSB). The second buffer 20 outputs a buffered write enable signal (WE) by processing an inverted buffered control signal (CS) and an input write enable signal (WEB). The write control signal generator 30 generates a write control signal (WCB) by operating and delaying the buffered control signal (CS) and the buffered write enable signal (WE). The output unit 40 outputs an input data to data lines (DL, DLB) based on the write control signal (WCB) from the write control signal generator 30.

The first buffer 10 includes a NOR gate 11 and series inverters 12, 13. One input of the NOR gate 11 is grounded and the other input receives the control signal (CSB). The series inverters 12, 13 sequentially delay an output control signal (CS) from the NOR gate 11. The second buffer includes a NOR gate 21 for NORing the buffered control signal (CS) inverted by an inverter I1 and the write enable signal (WEB). The second buffer 20 further includes inverters 22, 23 for sequentially delaying an output signal from the NOR gate 21.

The write control signal generator 30 includes inverters 31, 32 for inverting the buffered control signal (CS) and the buffered write enable signal (WE) output from the first and second buffers 10, 20, respectively. The write control signal generator 30 further includes a NOR gate 33 for NORing the outputs from the inverters 31, 32, a delay unit 34 having series inverters 34', 34" for delaying an output from the NOR gate 33 and a NAND gate 35 for NANDing an output from the delaying unit 34 and an output from the NOR gate 33. The write control signal generator 30 outputs the write control signal (WCB) after series inverters 36, 37 sequentially delay the output of the NAND gate 35.

The output unit 40 includes NOR gates 41, 42 for NORing the input data and the input data inverted by an inverter I2, respectively, with the write control signal (WCB). The output unit 40 also includes inverters 43, 44 for respectively inverting outputs from the NOR gates 41, 42.

The operation of the related art write control circuit shown in FIG. 1 will now be described. First, the case where the control signal (CSB) is toggled to a low level with the write enable signal (WEB) previously toggled from a high level to a low level is described referring to the waveforms in FIGS. 2A–2K.

As shown in FIG. 2A, with the write enable signal (WEB) toggled to a low level, the control signal (CSB) is toggled to a low level and input to the first buffer 10. The control signal (CSB) is changed to the buffered control signal (CS) shown in FIG. 2B through the NOR gate 11 and the inverters 12, 13, and the buffered control signal (CS) is input to the write control signal generator 30. Substantially simultaneously, the buffered control signal (CS) is changed as shown in FIG. 2C through the inverter I1, and then input to the second buffer 20.

Next, the NOR gate 21 NORs the low level write enable signal (WEB) and the output from the inverter I1 and outputs a high level signal through the inverters 22, 23. Thus, a high level buffered write enable signal (WE) is output from the second buffer 20 as shown in FIG. 2E.

The inverters 31, 32 in the write control signal generator 30 invert the buffered control signal (CS) and the buffered write enable signal (WE), respectively. The inverted signals are NORed in the NOR gate 33 and then sequentially delayed by the inverters 34', 34" in the delay unit 34. The NAND gate 35 NANDs the outputs from the NOR gate 33 and the delay unit 34, and outputs the result to the inverters 36, 37 to generate the write control signal (WCB). Here, FIGS. 2H–2J show the waveforms of N5, N6 and the WCB signals.

The output unit 40 NORs the data and inverted data input through one input of the NOR gates 41, 42 and the write control signal (WCB) input through the other input of the NOR gates 41, 42. The output unit 40 outputs the resulting signals respectively through the inverters 43, 44. Thereby, as shown in FIG. 2K, data lines (DL, DLB) are changed to a high level and a low level, respectively, and the data is written in a memory cell (not illustrated).

Next, the case where the write enable signal (WEB) is toggled to a low level with the control signal (CSB) previously toggled from a high level to a low level is described with reference to the waveforms in FIGS. 3A–3K.

Based on the low level of the control signal (CSB), the first buffer 10 and the inverter I1 output a high level and an inverted low level buffered control signal (CS), as shown in FIGS. 3B and 3C.

With the control signal (CSB) toggled to low level, the write enable signal (WEB) shown in FIG. 3A is input to the second buffer 20. In the second buffer 20, the NOR gate 21 NORs the output from the inverter I1 and the write enable signal (WEB) to output the buffered write enable signal (WE) from the inverters 22, 23. The buffered write enable signal (WE) has the waveform shown in FIG. 3E.

Next, the buffered control signal (CS) and the buffered write enable signal (WE) are input to the write control signal generator 30 and generate the waveform shown in FIG. 2H after passing through the inverters 31, 32, the NOR gate 33 and the delay unit 34. The NAND gate 35 NANDs the outputs from the NOR gate 33 and the delay unit 34 to output the signal shown in FIG. 2I. The signal output from the NAND gate 35 is sequentially delayed in the inverters 36, 37, resulting in the low level write control signal (WCB) as shown in FIG. 2J.

Accordingly, the output unit 40 outputs the input data based on the write control signal (WCB) through the NOR gates 41, 42 and the inverters 43, 44. As shown in FIG. 2K, while the write control signal (WCB) is high level, the output unit 40 outputs a high level signal regardless of the input data. Thus, in this case the data lines (DL, DLB) are high level. While the write control signal (WCB) is low level, the output unit 40 outputs the data, which allows the data lines (DL, DLB) to be a high level and a low level, respectively. As shown in FIG. 2K, in this case, the data is written in the memory cell (not illustrated).

However, a write control signal (WCB) generated when the write enable signal (WEB) is toggled low first from a high level to a low level and then the control signal (CSB) is toggled is additionally delayed by as long as the number of the delay devices of the first buffer 10 relative to a write control signal (WCB) generated when the control signal (CSB) is toggled first from a high level to a low level and then the write enable signal (WEB) is toggled to a low level.

Therefore, since an identical parametric control based on the control signal (CSB) and the write enable signal (WEB) is lacking in write cycles of related art write control circuits. Accordingly, control of a data recording operation is disadvantageously effected.

The above references are incorporated by reference herein where appropriate for appropriate teachings of additional or alternative details, features and/or technical background.

SUMMARY OF THE INVENTION

An object of the present invention is to substantially obviate one or more of the problems because of limitations and disadvantages of the related art.

Another object of the present invention is to improve serviceability of a write control circuit.

Another object of the present invention is to provide a write control circuit that controls write cycles of data recording operations using identical control based on a control signal and a write control signal.

To achieve these and other advantages and in accordance with the purpose of the present invention, a write control circuit in a semiconductor memory device includes a first buffer for receiving a control signal and outputting a buffered control signal, a second buffer for receiving the buffered control signal from the first buffer and a write enable signal and outputting a buffered write enable signal, and an output unit for output an input data to data lines in accordance with a write control signal. The write control circuit further includes a write controller for detecting an input of the control signal and the write enable signal and controlling a selectable delay of the write control signal, and a write control signal generator for generating the write control signal based on the selectable delay, the buffered control signal and the buffered write enable signal.

The present invention may be achieved in part or in whole by a controller circuit for a semiconductor memory device, comprising: a write control signal generator including a delay circuit that causes one of a first delay and a second delay based on a delay control signal that generates a write control signal based on the delay circuit, a buffered control signal and a buffered write enable signal; a write controller that receives a control signal and a write enable signal and generates the delay control signal to maintain substantially identical parametric control of a write operation cycle relative to the control signal and the write enable signal.

The present invention also may be achieved in part or in whole by a method for controlling a write cycle for a semiconductor memory device, comprising: outputting a buffered control signal based on a control signal; outputting a buffered write enable signal based on the buffered control signal and a write enable signal; controlling a selectable delay with a write controller based on the control signal and the write enable signal; and generating a write control signal based on the selectable delay, the buffered control signal and the buffered write enable signal; wherein the write control signal maintains consistent parametric control of the write operation cycle relative to the write enable signal and the control signal; and outputting input data to respective data lines in the write cycle based on the write enable signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5A–5S and FIGS. 6A–6S are diagrams showing exemplary waveforms of signals in FIG. 4.

DETAILED DESCRIPTION OF PREFERRED EMBODIMENTS

With reference to FIGS. 4–6S, a first preferred embodiment of a write control circuit according to the present invention is described below.

Figure 1:
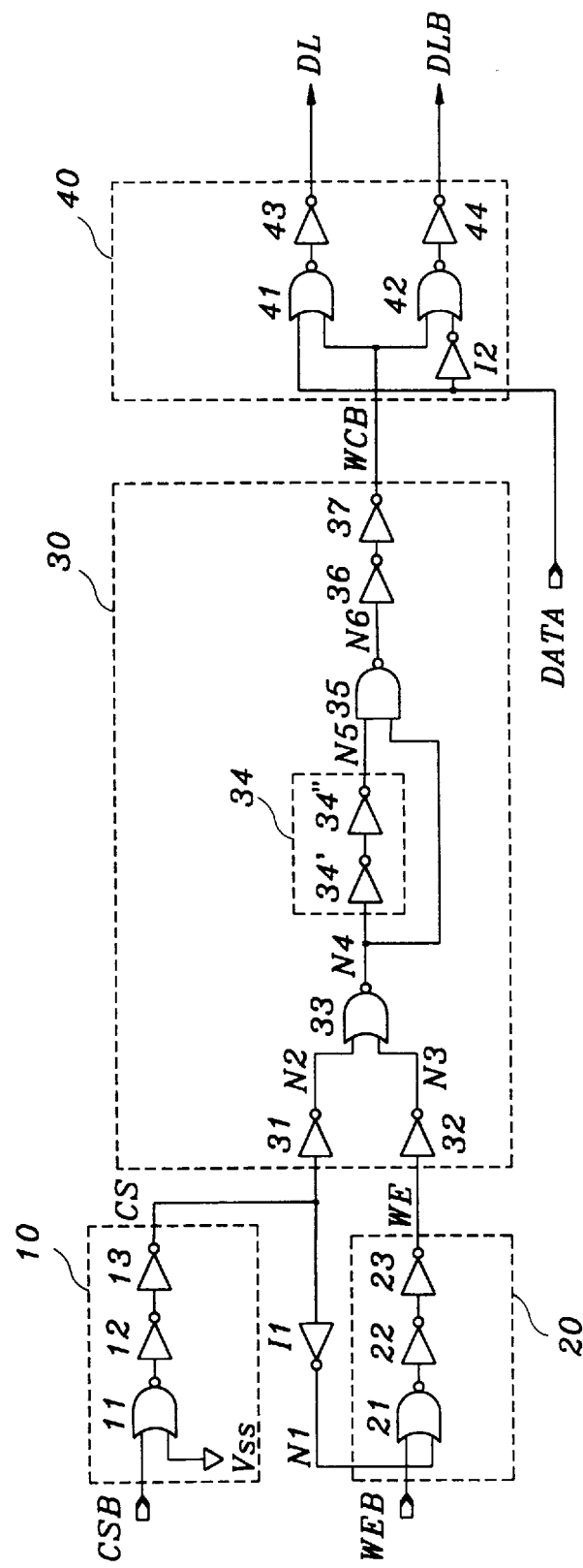
FIG. 1 is a schematic diagram showing a write control circuit according to related art.
Figure 2:
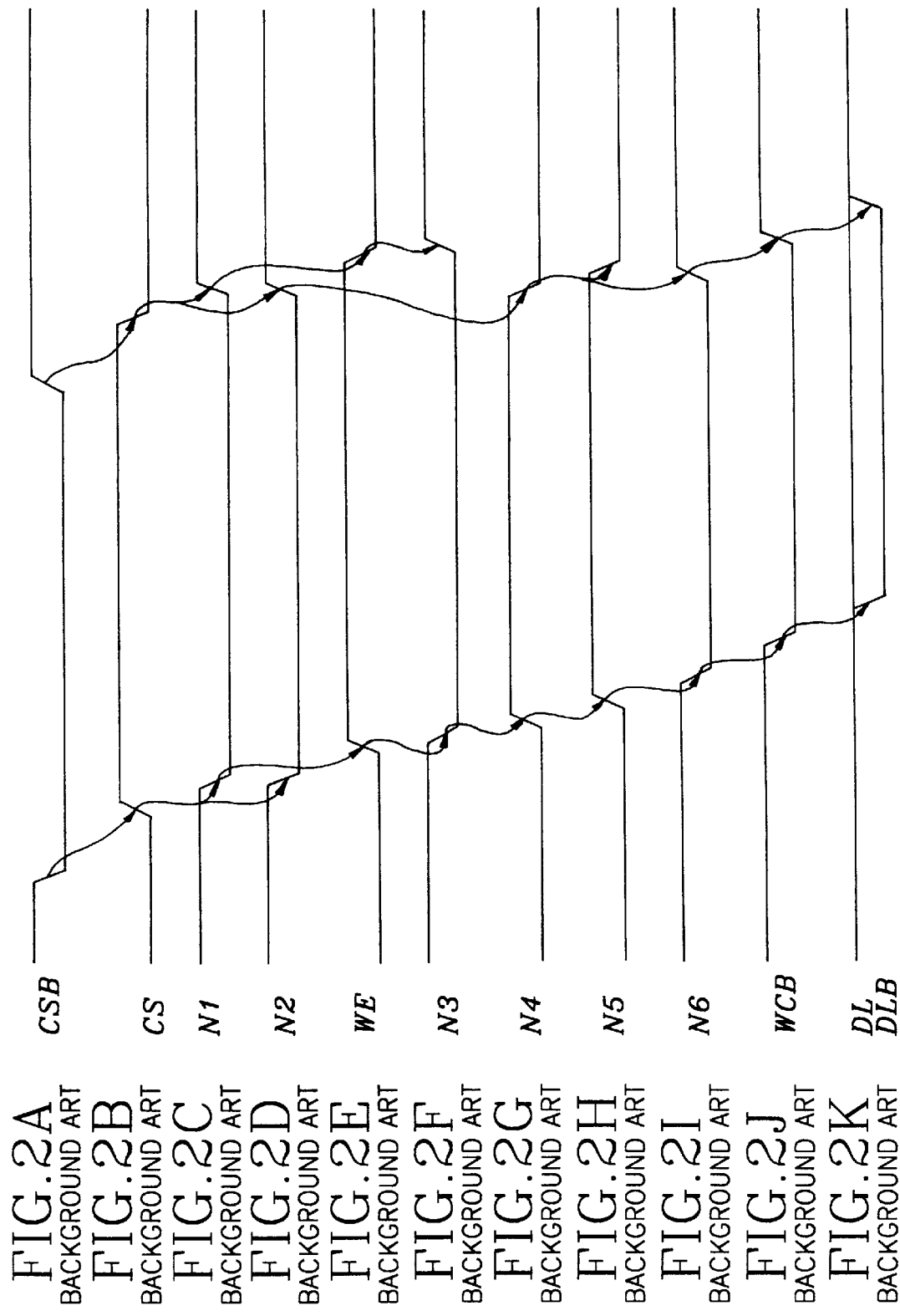
FIGS. 2A–2K are diagrams showing exemplary waveforms of signals in FIG. 1.
Figure 3:
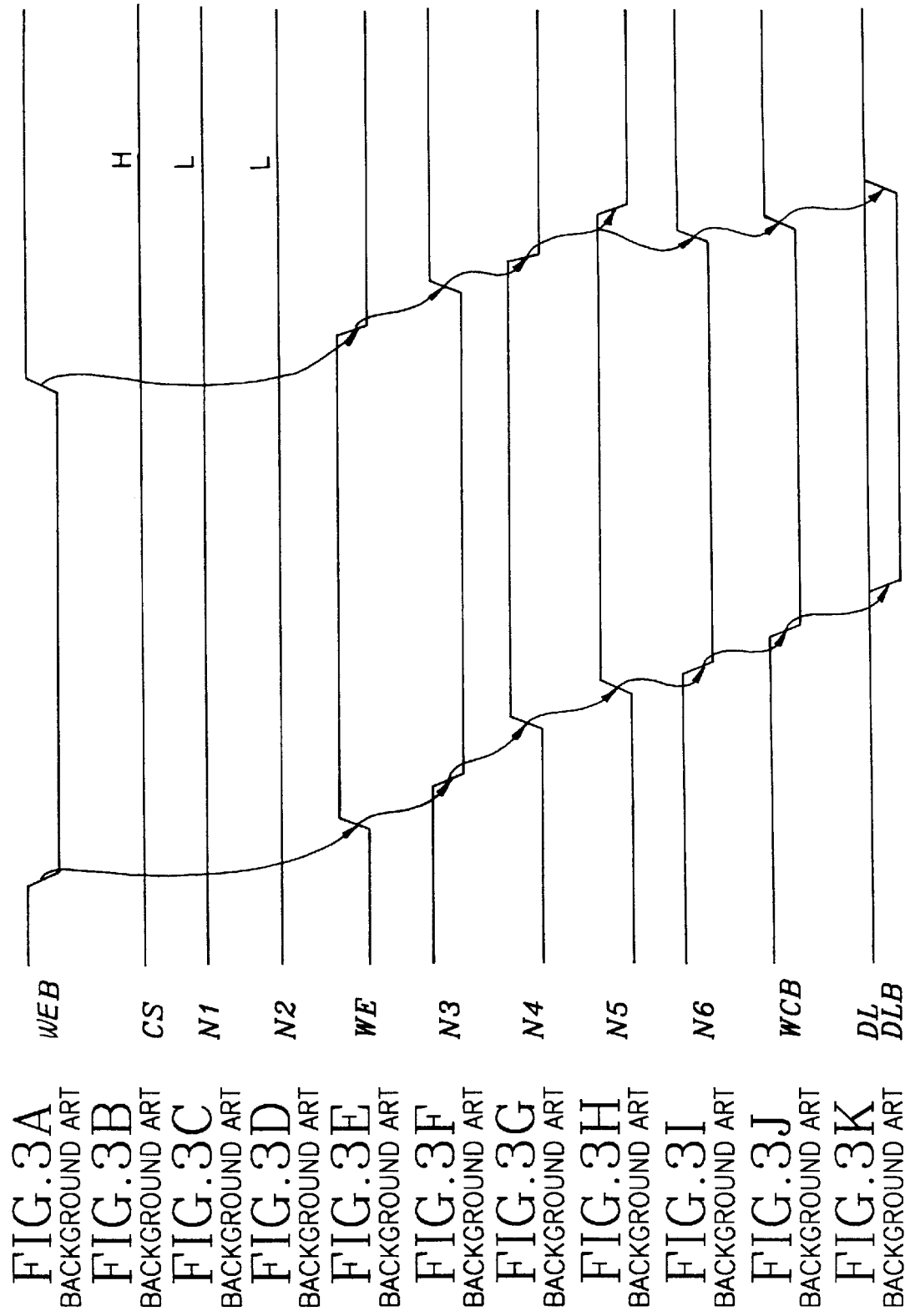
FIGS. 3A–3K are diagrams showing exemplary waveforms of signals in FIG. 1.
Figure 4:
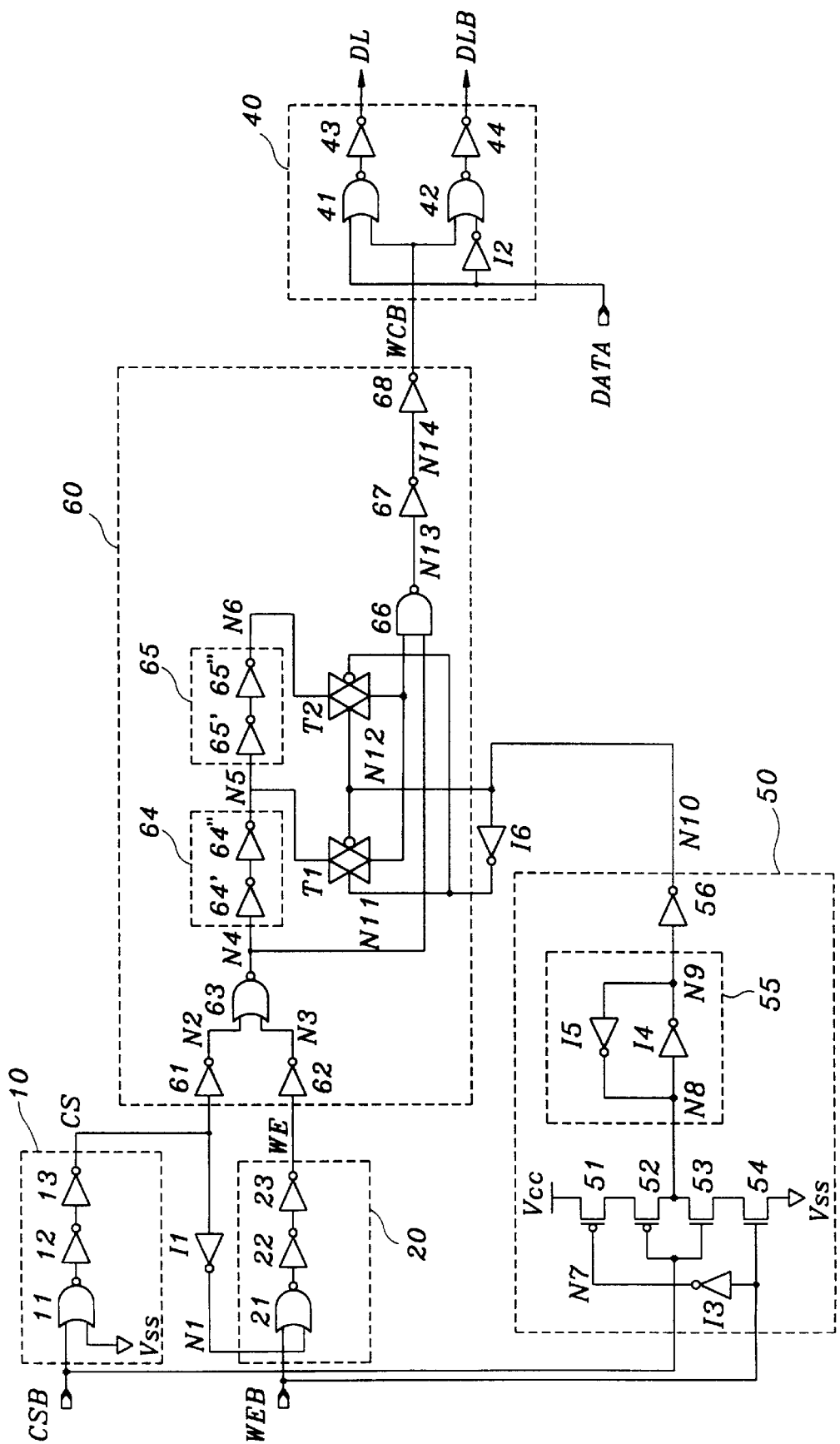
FIG. 4 is a schematic diagram showing a write control circuit according to the present invention.

As shown in FIG. 4, a write control circuit includes a first buffer 10, a second buffer 20 and an output unit 40 configured as the related art described above. Thus, the detailed explanation is omitted here. The write control circuit further includes a write controller 50 and a write control signal generator 60. The write controller 50 detects an input condition of a control signal (CSB) and a write enable signal (WEB) and outputs a control signal for controlling an outputting point of the write control signal (WCB). The write control signal generator inputs and processes the buffered control signal (CS) and the buffered write enable signal (WE). The write control signal generator 60 then selects a delayed signal based on the control of the write controller 50. The write control signal generator 60 further generates the write control signal (WCB).

As shown in FIG. 4, in the write controller 50, PMOS transistors 51, 52 and NMOS transistors 53, 54 are connected in series between a supply voltage source (Vcc) and ground. The control signal (CS) is commonly input to gates of the PMOS transistor 52 and the NMOS transistor 53. The write enable signal (WEB) is input to a gate of the PMOS transistor 51 and is input to a gate of the NMOS transistor 54 via an inverter (I3). An output terminal connected between drains of the PMOS transistor 52 and the NMOS transistor 53 is connected to an inverter 56 through a latch unit 55. The latch unit 55 includes inverters (I4, I5) connected oppositely in parallel.

The write control signal generator 60 includes inverters 61, 62 for inverting the buffered control signal (CS) from the first buffer 10 and the buffered write enable signal (WE) from the second buffer 20, respectively. The write control signal generator 60 further includes a NOR gate 63 for NORing the outputs from the inverters 61, 62, first and second delay units 64, 65 for selectively sequentially delaying the output from the NOR gate 63 through series inverters 64', 64" and series inverters 65', 65", respectively. The write control signal generator 60 also includes transmission gates (T1, T2), a NAND gate 66 and series inverters 67, 68. The transmission gates (T1, T2), respectively, are connected to the delay units 64, 65 and complementarily enabled based on control signals from the write controller 50. The NAND gate 66 NANDs an output from the NOR gate 63 and an output from the transmission gate T1 or T2. The series inverters 67, 68 sequentially delay an output from the NAND gate 66.

Operation of the first preferred embodiment of a write control circuit according to the present invention will now be described. First, the case where the control signal (CSB) is toggled from a high level to a low level with the write enable signal (WEB) previously toggled to a low level is described.

Initially, the NMOS transistors 53, 54 in the write controller 50 are turned on in accordance with high levels of the write enable signal (WEB) and the control signal (CSB). A node (N8) at the input side of the latch unit 55 is maintained low level before the write enable signal (WEB) is toggled from a high level to a low level.

When the write enable signal (WEB) shown in FIG. 5A is toggled from a high level to a low level, the NMOS transistors 53, 54 in the write controller 50 are turned off, which shuts off the output. However, the latched low level of the node (N8) maintains a node (N10) at the output side of the latch unit 55 at a low level, as shown in FIG. 5N.

Next, as shown in FIG. 5B, when the control signal (CSB) is toggled from a high level to a low level, the first buffer 10 outputs a high level buffered control signal (CS), as shown in FIG. 5C. Further, the second buffer 20 outputs a high level buffered write enable signal (WE), as shown in FIG. 5F.

The inverters 61, 62 in the write control signal generator 30 invert the buffered control signal (CS) and the buffered write enable signal (WE), respectively. The inverted signals are NORed in the NOR gate 63 and sequentially delayed through the inverters 64', 64", 65', 65" in the first and second delay units 64, 65, respectively. FIGS. 5E–5J show the waveforms of these signals.

In this case, the transmission gate(T1) is turned on, and the transmission gate T2 is turned off according to the control signal from the write controller 50. Thus, a low level of the control signal from the node (N10) causes an output from the first delay unit 64 to be input to the NAND gate 66 through the transmission gate (T1). The NAND gate 66 NANDs the outputs from the NOR gate 63 and the first delay unit 64 and outputs a signal shown in FIG. 5Q. Accordingly, the low level write control signal (WCB) shown in FIG. 5R is generated by the write control signal generator 60.

While the write control signal(WCB) is high level, the output unit 40 outputs a high level signal regardless of the input data. In this case, the data lines (DL, DLB) both become high level. While the write control signal (WCB) is low level, the output unit 40 outputs the data, which allows the data lines (DL, DLB) to be a high level and a low level, respectively. As shown in FIG. 5S, this results in the data being recorded on the memory cell (not illustrated).

Next, the case where the write enable signal (WEB) is toggled from a high level to a low level with the control signal (CSB) previously toggled to a low level is described with reference to FIGS. 6A–6S.

Initially, the NMOS transistors 53, 54 in the write controller 50 are turned on in accordance with high levels of the write enable signal (WEB) and the control signal (CSB). Thus, the node (N8) is maintained low level before the control signal (CSB) is toggled from a high level to a low level. When the control signal (CSB) is toggled from a high level to a low level as shown in FIG. 6A, the PMOS transistors 51, 52 in the write controller 50 are turned on and the node (N8) becomes high level. The node N8 signal is shown in FIG. 6L.

As shown in FIG. 6B, when the write enable signal (WEB) is toggled from a high level to a low level, the PMOS transistor 51 is turned off, which shuts off the output. However, the high level of the output node (N8) is latched by the latch unit 55. Thus, the node (N10) is maintained high level, as shown in FIG. 6N. Further, the first buffer 10 outputs a high level buffered control signal (CS) shown in FIG. 6C, and the second buffer 20 outputs a high level buffered write enable signal (WE) shown in FIG. 6F.

The inverters 61, 62 in the write control signal generator 30 invert the buffered control signal (CS) and the buffered write enable signal (WE), respectively. The inverted signals are NORed in the NOR gate 63 and then sequentially delayed through the inverters 64', 64", 65', 65" in the first and second delay units 64, 65, respectively. FIGS. 6E through 6J show the waveforms of these signals.

In this case, the transmission gate(T1) is turned off, and the transmission gate T2 is turned on according to the control signal from the write controller 50. Thus, a high level control signal from the node (N10) causes an output from the second delay unit 65 to be input to the NAND gate 66 through the transmission gate (T2). The NAND gate 66 NANDs the outputs from the NOR gate 63 and the second delay unit 65 and outputs a signal shown in FIG. 6Q. The low level write control signal (WCB) is generated by the write control signal generator 60 as shown in FIG. 6R.

Accordingly, the output unit 40 outputs the data in accordance with the write control signal (WCB). Thereby, the data is written into the memory cell (not illustrated).

That is, according to a write control circuit of the present invention, when the control signal (CSB) is first toggled to low level and later the write enable signal (WEB) is toggled to a low level, the output from the second delay unit 65 is selected to output the write enable signal (WCB). In this manner, the delay in the first buffer 10 is considered when outputting the write enable signal (WCB). When the write enable signal (WEB) is toggled first to a low level and later the control signal (CSB) is toggled to a low level, the output from the first delay unit 64 is selected to output an identical write enable signal (WCB).

As described in detail above, the write control circuit according to the present invention has the advantage of easily performing write control of data using identical parametric control relative to a control signal (CSB) and a write enable signal (WEB) in a write cycle.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A write control circuit for a semiconductor memory device, comprising:
   a first buffer that receives a control signal and outputs a buffered control signal;
   a second buffer that receives the buffered control signal from the first buffer and a write enable signal and outputs a buffered write enable signal;
   a write controller that receives the control signal and the write enable signal and controls a selectable delay; and
   a write control signal generator including the selectable delay that generates a write control signal based on the selectable delay, the buffered control signal and the buffered write enable signal.

2. The circuit of claim 1, wherein the write control circuit maintains consistent parametric control of the write control signal relative to the write enable signal and the control signal.

3. The circuit of claim 1, further comprising an output unit that outputs input data to respective data lines in a write cycle based on the write enable signal.

4. The circuit of claim 1, wherein the write controller controls the selectable delay by selecting an output point of an intermediate signal in the write control signal generator.

5. The circuit of claim 1, wherein the write controller controls the selectable delay by selecting to pass an intermediate signal in the write control signal generator through a first delay when a write cycle is controlled by the write enable signal transition from high level to low level and a second delay when the write cycle is controlled by the control signal transition from high level to low level in the write control signal generator.

6. The circuit of claim 5, wherein the first delay is greater than the second delay.

7. The circuit of claim 5, wherein the first delay comprises passing the intermediate signal through four inverters and the second delay comprises passing the intermediate signal through two inverters.

8. The circuit of claim 1, wherein the write controller comprises:
   first and second inverters;
   first and second PMOS transistors;
   first and second NMOS transistors, wherein the first and second PMOS transistors and the first and second NMOS transistors are coupled in series between a supply voltage source and ground, the control signal is commonly input to a gate of the second PMOS transistor and a gate of the first NMOS transistor, and the write enable signal is input to a gate of the first PMOS transistor and a gate of the second NMOS transistor through the first inverter; and
   a latch unit including a pair of inverters coupled in anti-parallel, wherein the latch unit is between commonly coupled drains of the second PMOS transistor and the first NMOS transistor and the second inverter that outputs a delay control signal.

9. The circuit of claim 1, wherein the write control signal generator comprises:
   a first inverter that inverts the buffered control signal from the first buffer;
   a second inverter that inverts the buffered write enable signal from the second buffer;
   a NOR gate that NORs respective outputs from the first and second inverters;
   a delay circuit including first and second delay units that delay an output from the NOR gate;
   a first transmission gate coupled to the first delay unit;
   a second transmission gate coupled to the second delay unit, wherein the first and second transmission gates are complementarily turned on based on a delay control signal received from the write controller;
   a NAND gate that NANDs an output from the NOR gate and an output from one of the first and second transmission gates; and
   series inverters that sequentially delay an output from the NAND gate to generate the write control signal.

10. The circuit of claim 9, wherein the write control signal generator selects an output from the second delay unit to output the write control signal when the delay control signal is a high level and selects an output from the first delay unit to obtain the delayed write control signal when the delay control signal is a low level.

11. The circuit of claim 1, wherein the write controller outputs a high level delay control signal when the control signal is toggled from high level to low level prior to the write enable signal, and outputs a low level delay control signal when the write enable signal is toggled from high level to low level before the control signal is toggled from high level to low level.

12. A controller circuit for a semiconductor memory device, comprising:
   a write control signal generator including a delay circuit that causes one of a first delay and a second delay based on a delay control signal that generates a write control signal based on the delay circuit, a buffered control signal and a buffered write enable signal;
   a write controller that receives a control signal and a write enable signal and generates the delay control signal to maintain substantially identical parametric control of a write operation cycle relative to the control signal and the write enable signal.

13. The write controller of claim 12, further comprising:
   a first buffer that receives the control signal and outputs the buffered control signal;
   a second buffer that receives the buffered control signal from the first buffer and the write enable signal and outputs the buffered write enable signal.

14. The write controller of claim 13, further comprising an output unit that outputs input data to respective data lines in a write cycle based on the write enable signal.

15. A method for controlling a write cycle for a semiconductor memory device, comprising:
   outputting a buffered control signal based on a control signal;
   outputting a buffered write enable signal based on the buffered control signal and a write enable signal;
   controlling a selectable delay with a write controller based on the control signal and the write enable signal; and
   generating a write control signal based on the selectable delay, the buffered control signal and the buffered write enable signal; wherein the write control signal maintains consistent parametric control of the write cycle relative to the write enable signal and the control signal; and
   outputting input data to respective data lines in the write cycle based on the write enable signal.

16. The circuit of claim 15, wherein the controlling step comprises:
   selecting a first delay when the write cycle is controlled by the write enable signal transition from low level to high level; and
   selecting a second delay when the write cycle is controlled by the control signal transition from low level to high level, wherein the first delay is longer than the second delay.

* * * * *

UNITED STATES PATENT AND TRADEMARK OFFICE
CERTIFICATE OF CORRECTION

PATENT NO. : 5,818,767
DATED : October 6, 1998
INVENTOR(S) : Kyung-Yul KIM and Jong-Hoon PARK It is certified that error appears in the above-identified patent and that said Letters Patent is hereby corrected as shown below:

In the Title change "WIRE" to --WRITE--.

Signed and Sealed this

Twenty-third Day of February, 1999

Attest:

Q. TODD DICKINSON

*Attesting Officer*  *Acting Commissioner of Patents and Trademarks*